(12) United States Patent
Fraisse et al.

(10) Patent No.: US 9,269,345 B2
(45) Date of Patent: Feb. 23, 2016

(54) SIGNAL PROCESSING

(75) Inventors: Christian Fraisse, Grenoble (FR);
Angelo Nagari, Grenoble (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 164 days.

(21) Appl. No.: 14/119,512

(22) PCT Filed: May 15, 2012

(86) PCT No.: PCT/EP2012/059043
§ 371 (c)(1),
(2), (4) Date: Dec. 26, 2013

(87) PCT Pub. No.: WO2012/163672
PCT Pub. Date: Dec. 6, 2012

(65) Prior Publication Data
US 2014/0153732 A1    Jun. 5, 2014

Related U.S. Application Data

(60) Provisional application No. 61/507,473, filed on Jul. 13, 2011.

(30) Foreign Application Priority Data

May 27, 2011    (EP) ..................... 11305653

(51) Int. Cl.
| A61F 11/06 | (2006.01) |
| G10K 11/16 | (2006.01) |
| G10K 11/178 | (2006.01) |
| H03F 3/217 | (2006.01) |
| H03K 7/08 | (2006.01) |

(52) U.S. Cl.
CPC .............. G10K 11/178 (2013.01); H03F 3/217 (2013.01); H03K 7/08 (2013.01)

(58) Field of Classification Search
None
See application file for complete search history.

(56) References Cited

U.S. PATENT DOCUMENTS

| 6,545,533 | B2 | 4/2003 | Karki et al. |
| 7,084,799 | B1 | 8/2006 | Butler |
| 7,656,214 | B1 | 2/2010 | Han |
| 2002/0075069 | A1 | 6/2002 | Karki et al. |
| 2004/0232978 | A1 | 11/2004 | Easson et al. |
| 2005/0053120 | A1 | 3/2005 | Kim et al. |
| 2005/0069019 | A1 | 3/2005 | Kaizuka |
| 2007/0290894 | A1 | 12/2007 | Ng et al. |
| 2008/0303572 | A1 | 12/2008 | Chang |

OTHER PUBLICATIONS

Sadamura, H., et al.,"Spread-Spectrum Clocking in Switching Regulators to Reduce EMI", 2002 IEEE Asia-Pacific Conference on ASIC, Proceedings, Aug. 8, 2002, pp. 141-144, IEEE, Taiwan.

*Primary Examiner* — Regina N Holder
(74) *Attorney, Agent, or Firm* — Coats & Bennett, PLLC

(57) ABSTRACT

The electronic device and a corresponding signal processing method disclosed herein reduces electromagnetic noise. To that end, the electronic device includes a delay line, an oscillator, and a modulator. The delay line generates a spread spectrum clock signal from an input clock signal, where a timing jitter and a period of jitter of the spread spectrum clock signal are controlled at each period of the spread spectrum clock signal based on a digital code. The oscillator uses the spread spectrum clock signal to generate a processing signal. The modulator modulates the processing signal as a function of an audio signal.

14 Claims, 6 Drawing Sheets

SIGNAL PROCESSING

TECHNICAL FIELD

The present invention relates to devices and methods for signal processing. It relates particularly to signal processing for reducing electromagnetic noise.

BACKGROUND

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section. Furthermore, all embodiments are not necessarily intended to solve all or even any of the problems brought forward in this section.

Audio Class-D drivers may be used in order to provide high powered audio output signal with high efficiency, typically comprised between 80 and 90%.

However, Class-D power stage also provides a lot of electromagnetic noise in the radio band, with particular frequency concentrations. This electromagnetic noise can perturb environment systems.

Electromagnetic interference (EMI) may be reduced by using solenoid inductance filters with concentrated magnetic field. However, such filters are expensive.

Electromagnetic interference (EMI) may also be reduced by using a spread-spectrum clock signal, which can be obtained with a phase locked loop or with a pseudo random noise. The use of a pseudo random noise is for example disclosed in U.S. Pat. No. 6,545,533.

However, the known systems do not permit to control the energy spectrum. As a consequence, noise is added into the audio band and reduces the dynamic range at around 91 dB/96 dB. This can be a main issue for example in case of a system given at 103 dB minimum.

There is a need for improved methods and devices for reduction of electromagnetic noise of audio Class-D drivers.

SUMMARY

To address these needs, a first aspect of the present invention relates to an electronic device, comprising:
a delay line configured to generate a spread spectrum clock signal from a clock signal, a timing jitter and a period jitter of the spread spectrum clock signal being controlled at each period of the spread spectrum clock signal depending on a digital code,
an oscillator configured to use the spread spectrum clock signal to generate a processing signal, and
a modulator configured to modulate the processing signal as a function of a signal.

This electronic device aims at reducing the electromagnetic noise.

The timing jitter and the period jitter may be controlled to follow predetermined distribution curves. The predetermined distribution curves may be sine waves.

The delay line may comprise a set of delay blocks in cascade, each delay block comprising an RC circuit, each delay block being controlled depending on one bit of the digital code.

A unitary delay quantization may be defined by the capacitor of a first RC circuit, the capacitor capacitance of each other RC circuit being a multiple of the first RC circuit capacitor capacitance.

The electronic device may further comprise a digital code generator configured to generate, at each period, a digital code, the digital code generator comprising:
a counter configured to generate a counter value from the clock signal, the counter having M outputs for generating a counter value comprising M bits, M being an integer,
a decoder configured to receive the M bits of the counter value and to set a binary variable value depending on the counter value, and
a sequencer configured to receive the binary variable value and to generate the digital code depending on the binary variable value.

The counter may comprise a set of latches in cascade, an output of each latch providing a bit of the counter value.

The sequencer may comprise a set of latches in cascade, an output of each latch providing a bit of the digital code.

A second aspect of the present invention relates to a method of audio signal processing, comprising steps of:
generating a spread spectrum clock signal from a clock signal, a timing jitter and a period jitter of the spread spectrum clock signal being controlled at each period of the spread spectrum clock signal depending on a digital code,
using the spread spectrum clock signal to generate a processing signal, and
modulating the processing signal as a function of a signal.

The timing jitter and the period jitter may be controlled to follow predetermined distribution curves. The predetermined distribution curves may be sine waves.

The method may comprise a step of generating, at each period, a digital code, the step comprising operations of:
generating a counter value from the clock signal,
setting a binary variable value depending on the counter value, and
generating the digital code depending on the binary variable value.

A third aspect of the present invention relates to a computer program product comprising a computer readable medium, having thereon a computer program comprising program instructions, the computer program being loadable into a data-processing unit and adapted to cause the data-processing unit to carry out the steps of any of the method according to the second aspect when the computer program is run by the data-processing unit.

BRIEF DESCRIPTION OF THE DRAWINGS

The present invention is illustrated by way of example, and not by way of limitation, in the figures of the accompanying drawings, in which like reference numerals refer to similar elements and in which.

DESCRIPTION OF EMBODIMENTS

Embodiments of the invention deal with the problem reducing electromagnetic noise of electronic devices such as audio Class-D drivers or switched-mode-Power-Supply devices.

Figure 1:
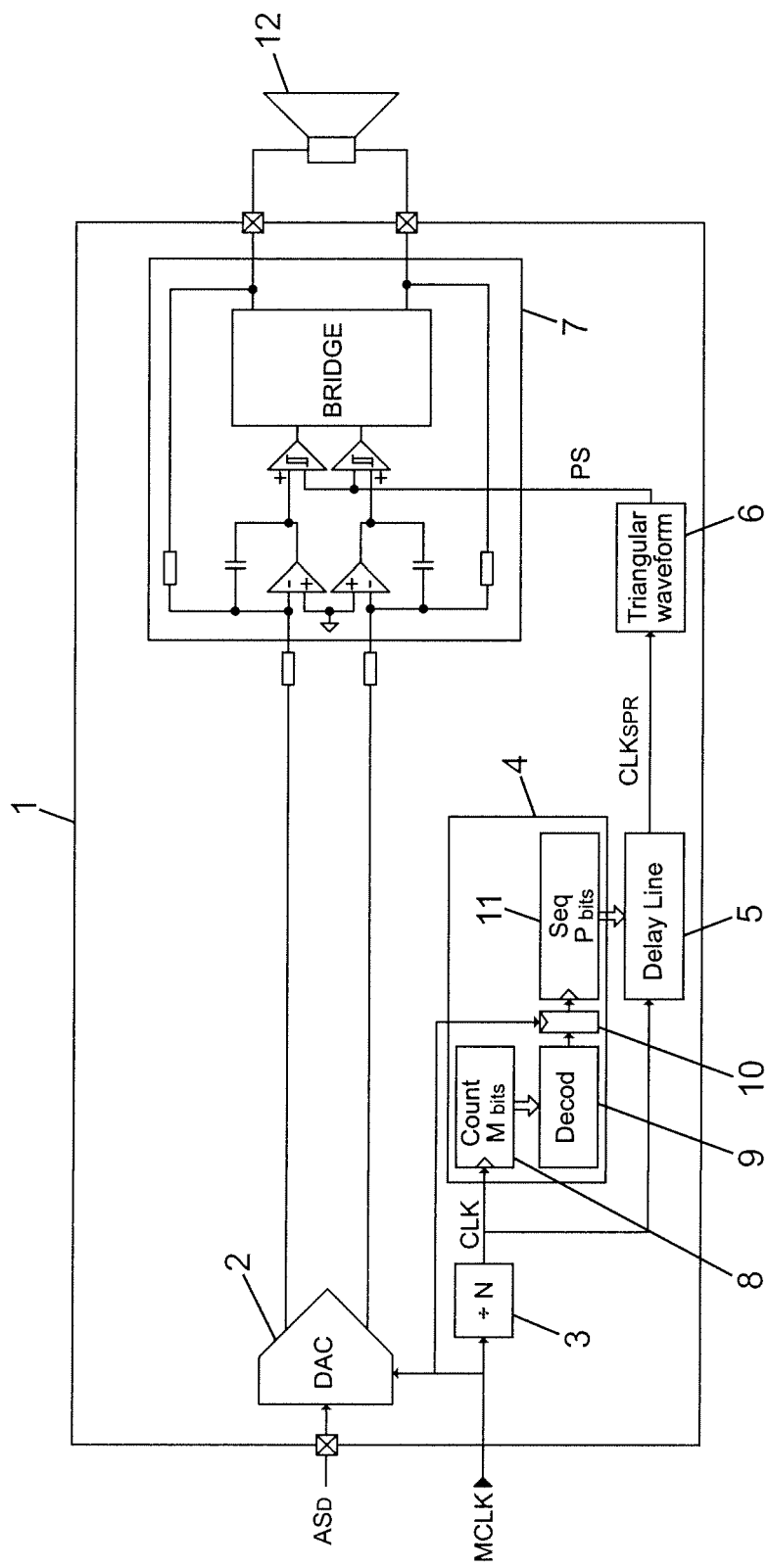
FIG. 1 is a schematic block diagram of an audio Class-D driver according to some embodiments of the invention.
Figure 2:
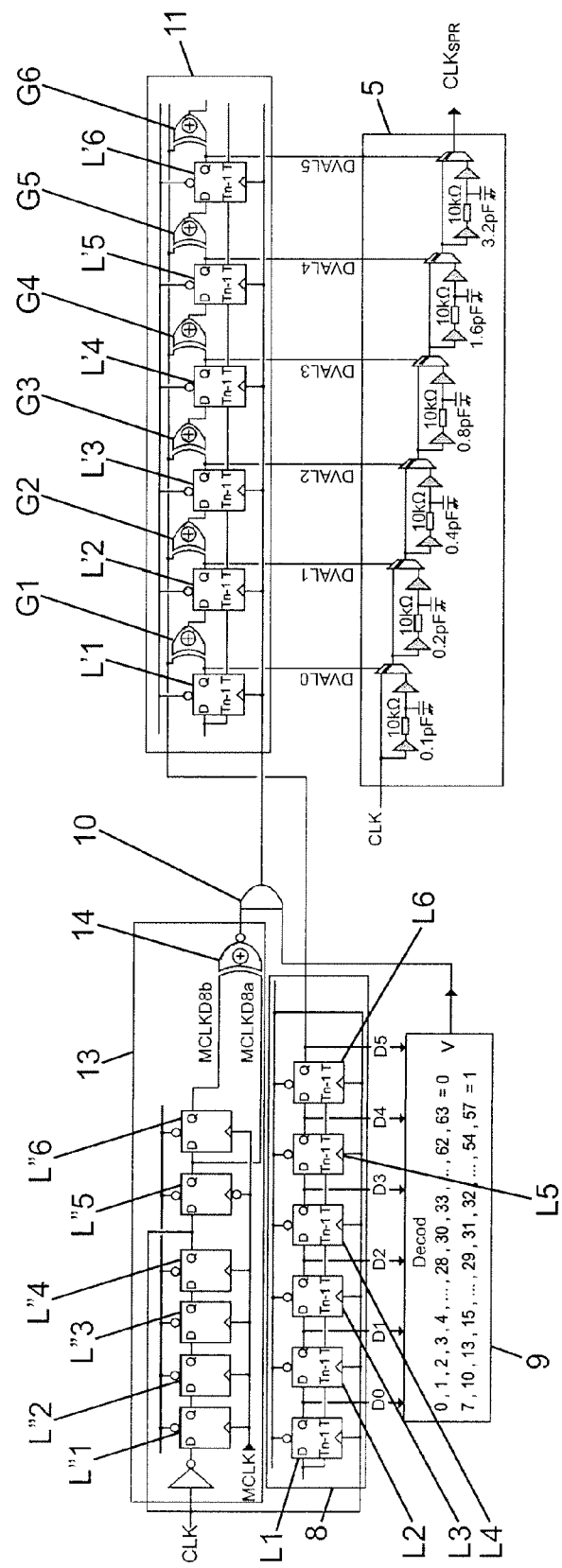
FIG. 2 is schematic diagram showing example of implementation of an audio Class-D driver.

FIG. 1 represents an audio Class-D driver 1 according to some embodiments of the invention, and FIG. 2 shows example of implementation of the audio Class-D driver 1. The audio Class-D driver 1 is coupled to receive in input a digital audio signal $AS_D$ and a master clock signal MCLK.

The audio Class-D driver 1 comprises a digital-to-analog converter (DAC) 2, a frequency divider 3, a digital code generator 4, a programmable delay line 5, an oscillator 6, and a modulator 7.

The DAC 2 is coupled to receive the digital audio signal $AS_D$ and the master clock signal MCLK. The DAC 2 is configured to use the master clock signal MCLK to convert the digital audio signal $AS_D$ to an analog audio signal $AS_A$.

In some embodiments, the audio signal received by the audio driver 1 is an analog signal, and the audio driver 1 does not comprise a DAC.

The frequency divider 3 is coupled to receive the master clock signal MCLK. The frequency divider 3 is configured to divide the frequency of the master clock signal MCLK by a predetermined factor N to obtain a clock signal CLK with a reduced frequency, N being an integer. Preferably N>4. For example N=8.

The digital code generator 4 comprises a counter 8, a decoder 9, a logic gate block 10 and a sequencer 11.

The counter 8 is coupled to receive the clock signal CLK. The counter 8 is configured to generate, at each period of the clock signal CLK, a M bits code corresponding to a counter value, M being an integer.

As represented in FIG. 2, the counter 8 may comprise a set of latches $L_1$ to $L_k$ in cascade, with k=M. For example, the latches $L_1$ to $L_k$ are D latches, the Q output of one latch $L_i$ being connected to the D input of the next latch $L_{i+1}$, the T output of one latch $L_i$ being connected to the Tn-1 input of the next latch $L_{i+1}$, the clock inputs of the latches $L_1$ to $L_k$ being coupled to receive the clock signal CLK. The Q output of each latch $L_1$ to $L_k$ provides a bit of the M bits code. For example, M=6 and the counter 8 then provides a 64 times count-uncount sequence, that is to say that the counter value is between 0 and 63 for a period of 128*1/CLK.

The decoder 9 is coupled to receive the M bits codes from the counter 8. The decoder 9 is configured to set, at each reception of a M bits code, a binary variable V value depending on the counter value corresponding to the M bits code.

For example, the decoder 9 may be configured to set the variable V to '1' when the counter value is equal to 7, 10, 13, 15, 17, 18, 20, 21, 23, 24, 26, 27, 28, 29, 31, 32, 33, 35, 36, 37, 38, 40, 41, 43, 44, 46, 47, 49, 51, 54 or 57, and to set the variable V to '0' for other counter values.

The logic gate block 10 comprises an AND logic gate coupled to receive the master clock signal MCLK and a signal containing the successive variable V values. The output signal value of the logic gate block 10 is equal to '1' when the master clock signal MCLK and the variable V value are equal to '1', and is equal to '0' in other cases.

The input of the sequencer 11 is connected to the output of the logic gate block 10. The sequencer 11 is configured to generate, at each front edge of the output signal of the logic gate block 10, a P bits code corresponding to a counting value of the sequencer 11, P being an integer. For example P=6.

As represented in FIG. 2, the sequencer 11 may comprise a set of latches $L'_1$ to $L'_y$ in cascade, with y=P. For example, the latches $L'_1$ to $L'_y$ are D latches, the Q output of one latch $L'_i$ being connected to the D input of the next latch $L'_{i+1}$ via a XOR logic gate $G_i$, the T output of one latch $L'_i$ being connected to the Tn-1 input of the next latch $L'_{i+1}$, the clock inputs of the latches $L'_1$ to $L'_k$ being coupled to receive the output signal of the AND logic gate 10. Each XOR logic gate $G_i$ is coupled to receive the Q output signal of the corresponding latch $L'_i$ and the Q output signal of the last latch $L_6$ of the counter 8. The Q output of each latch $L'_1$ to $L'_y$ provides a bit of the P bits code.

The delay line 5 is coupled to receive the P bits codes and the clock signal CLK. The delay line 5 is configured to generate a spread spectrum clock signal $CLK_{SPR}$ from the clock signal CLK by using the successive P bits codes from the sequencer 11. Thus, the delay line 5 aims at providing a quantified delay between ideal frequency Class-D-modulation and spread-spectrum one.

As represented in FIG. 2, the delay line 5 may comprise a set of delay blocks in cascade, each delay block comprising a digital buffered RC circuit, the RC circuits being weighted by number of unitary capacitors, in power of 2.

A unitary delay quantization is for instance defined by a capacitance of 0.2 pF, the delay line 5 comprising a RC circuit with a capacitance of 0.2 pF, a RC circuit with a capacitance of 0.4 pF, a RC circuit with a capacitance of 0.8 pF, a RC circuit with a capacitance of 1.6 pF, and a RC circuit with a capacitance of 3.2 pF. The RC circuits may have the same resistance, for example a resistance of 10 kΩ.

With this implementation, the unitary delay quantization is 2 nsec (R=10 kohms, C=0.2 pF). The higher weight is $2^4 \times 2$ nsec=32 nsec for 5 bits delay quantization (R=10 kohms, C=3.2 pF).

An extra RC circuit may be used to provide an extra bit with 1 nsec (R=10 kohms, C=0.1 pF) delay quantization in order to keep the duty cycle at around 50% for each programmed delay. Thus the two ramps of triangle Class-D modulation are identical. For a triangular Class-D-modulation, due to the 1 nsec extra bit, spectrum concentration is 1 GHz. At 1 GHz, Class-D modulation frequency may not be spread. But, at this frequency, there is very low energy spectrum on fixed frequency, so there is no need to spread.

The maximum programmed delay is then $(2^5-1) \times 2$ nsec=62 nsec.

At a given time, the spread spectrum clock signal $CLK_{SPR}$ may comprise, depending on the current P bits code, a quantified timing jitter and/or a quantified period jitter. We call timing jitter a difference between the time of the spread clock signal $CLK_{SPR}$ edge and the time of the clock signal CLK edge. We call period jitter the gap between two successive periods of the spread spectrum clock signal $CLK_{SPR}$. Timing jitter is the integral of period jitter.

The P bits codes thus aims at controlling the jitters, in particular to make them follow predetermined distribution curves. For example, the predetermined distribution curves may be single tone sine waves. The use of sine waves aims at keeping energy in well know domain, in order to keep spectrum around Class-D modulation frequency. The choice of the counter values for which the variable V has to be set to '1' depends on the distribution curves.

Figure 3A:
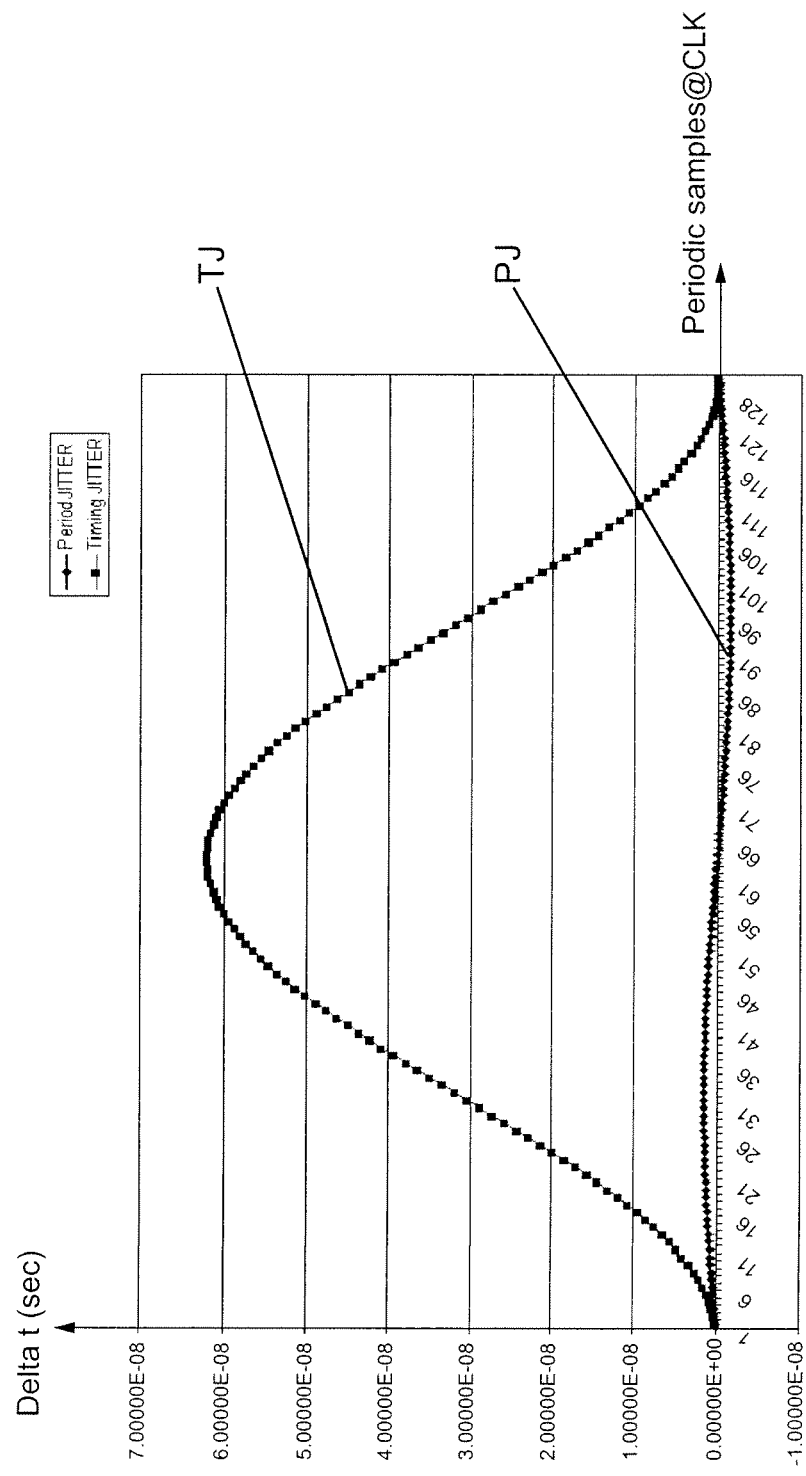
FIG. 3a and FIG. 3b are charts showing a target period jitter and a target timing jitter versus the successive modulation samples, in case of continuous time modulation and in case of delay quantization with 5 bits codes.
Figure 3B:
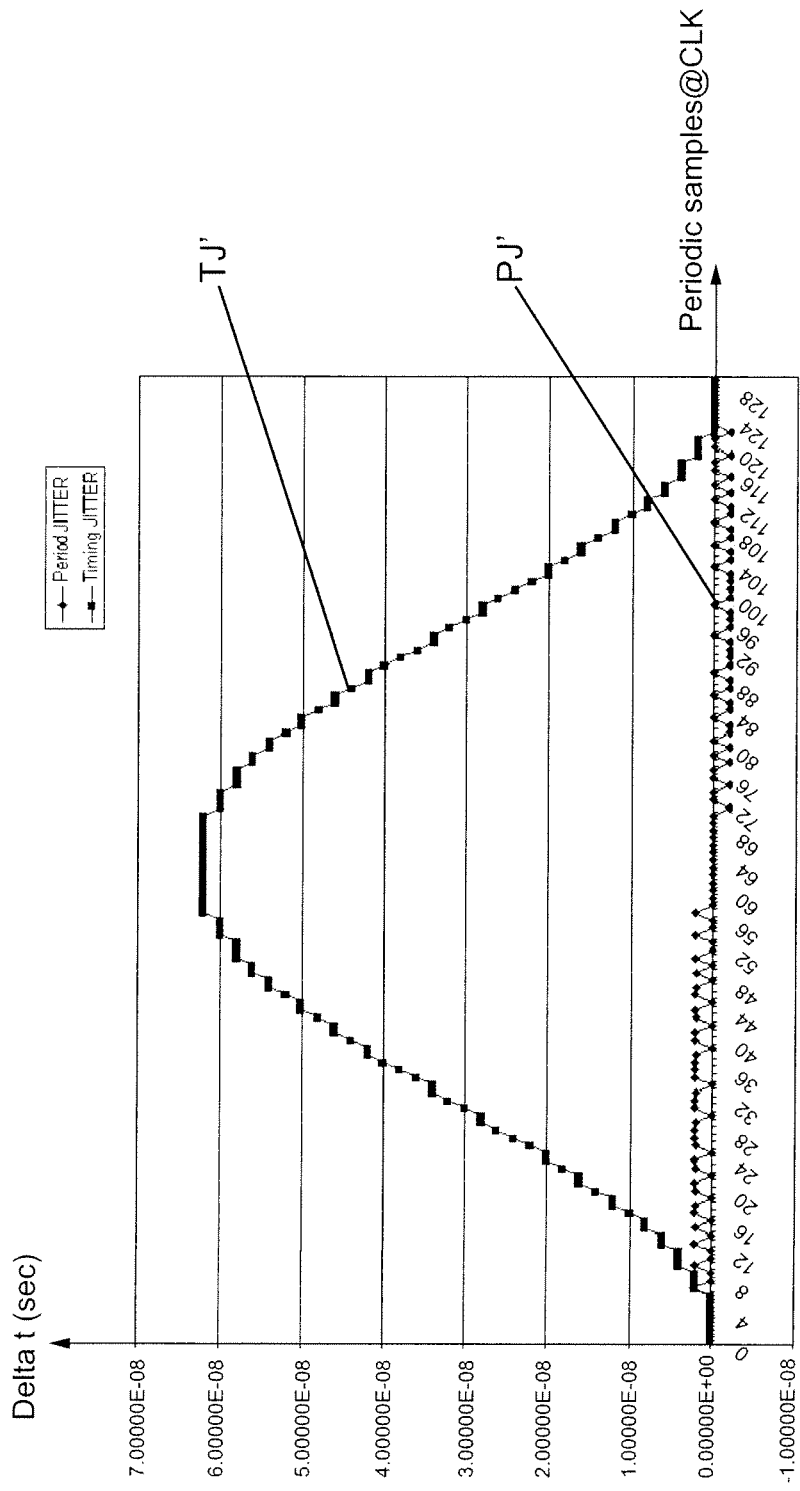

FIG. 3a is a chart which shows a possible target period jitter PJ and a possible target timing jitter TJ versus the successive modulation samples in case of continuous time modulation. FIG. 3b is a chart which shows the same target period jitter PJ' and timing jitter TJ' versus the successive modulation samples in case of delay quantization with 5 bits codes.

In this example, the period jitter amplitude is around 1.5 nsec, the period jitter being calculated as equal to A·sin(wt), with $w=2\pi/(2*2^M)$ and M=6. With the 5 bits quantization, the period jitter for consecutives periods can be equal to 0 nsec, to +2 nsec or to −2 nsec. The timing jitter amplitude of the sine-wave is around 62 nSec/2=31 nSec, the timing jitter being calculated as equal to A/w·cos(wt), with w=2π/

(2*2^M) and M=6. The integer M defines a ration between period jitter amplitude and timing jitter amplitude.

The oscillator 6 is coupled to receive the spread clock signal $CLK_{SPR}$, and is configured to use the spread clock signal $CLK_{SPR}$ to generate a spreading processing signal PS. The oscillator 6 may be a triangular waveform oscillator. A triangular waveform oscillator 6 provides ternary modulation (3 levels) with four equilibrated states. In alternative, the oscillator 6 may be a sawtooth oscillator.

The modulator 7 is coupled to receive the spreading processing signal PS and the analog audio signal $AS_A$. The modulator 7 is configured to modulate the spreading processing signal PS as a function of the audio signal $AS_A$.

The output of the modulator 7 is coupled to a speaker 12.

As represented in FIG. 2, the audio driver 1 may further comprises a clock delay block 13 for synchronizing the clock signal CLK with the data outputted by the decoder 9.

The clock delay block 13 may comprise a set of latches $L''_1$ to $L''_x$ in cascade, x being an integer. For example, the latches $L''_1$ to $L''_x$ are D latches, the Q output of one latch $L''_i$ being connected to the D input of the next latch $L''_{i+1}$, the D input of the first latch $L''_1$ being coupled to receive the clock signal CLK. The clock delay block 13 further comprises a XNOR logic gate 14 connected to the Q outputs of the two last latches $L''_{x-1}$ and $L''_x$. In the example of FIG. 2, x=6. The latches $L''5$ and $L''6$ then provide a synchronized delay for the control of the sequencer 11.

In this example, the AND logic gate 10 is coupled to receive the output of the XNOR logic gate 14 instead of the clock signal CLK.

Figure 4:
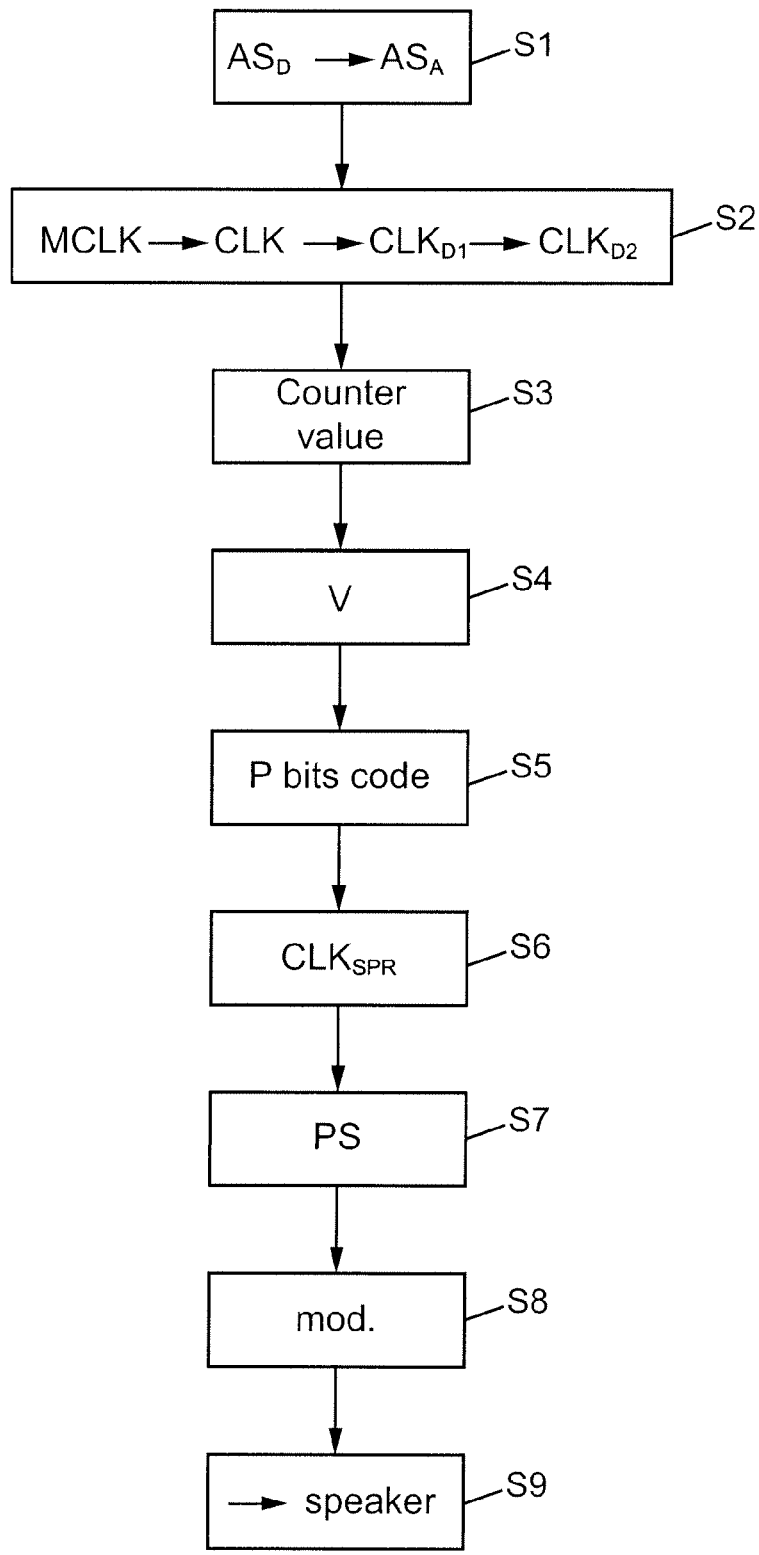
FIG. 4 is a flow chart showing steps of a method of audio signal processing according to some embodiments of the invention.

FIG. 4 represents steps of a method of audio signal processing according to some embodiments of the invention.

In step S1, the DAC 2 receives a digital audio signal $AS_D$ and uses the master clock signal MCLK to convert the digital audio signal $AS_D$ to an analog audio signal $AS_A$.

In step S2, the frequency divider 3 receives the master clock signal MCLK and divides the frequency of the master clock signal MCLK by the predetermined factor N to obtain the clock signal CLK.

Then, the clock delay block 13 receives the clock signal CLK and delays it to obtain a first delayed clock signal $CLK_{D1}$ and a second delayed clock signal $CLK_{D2}$.

Figure 5:
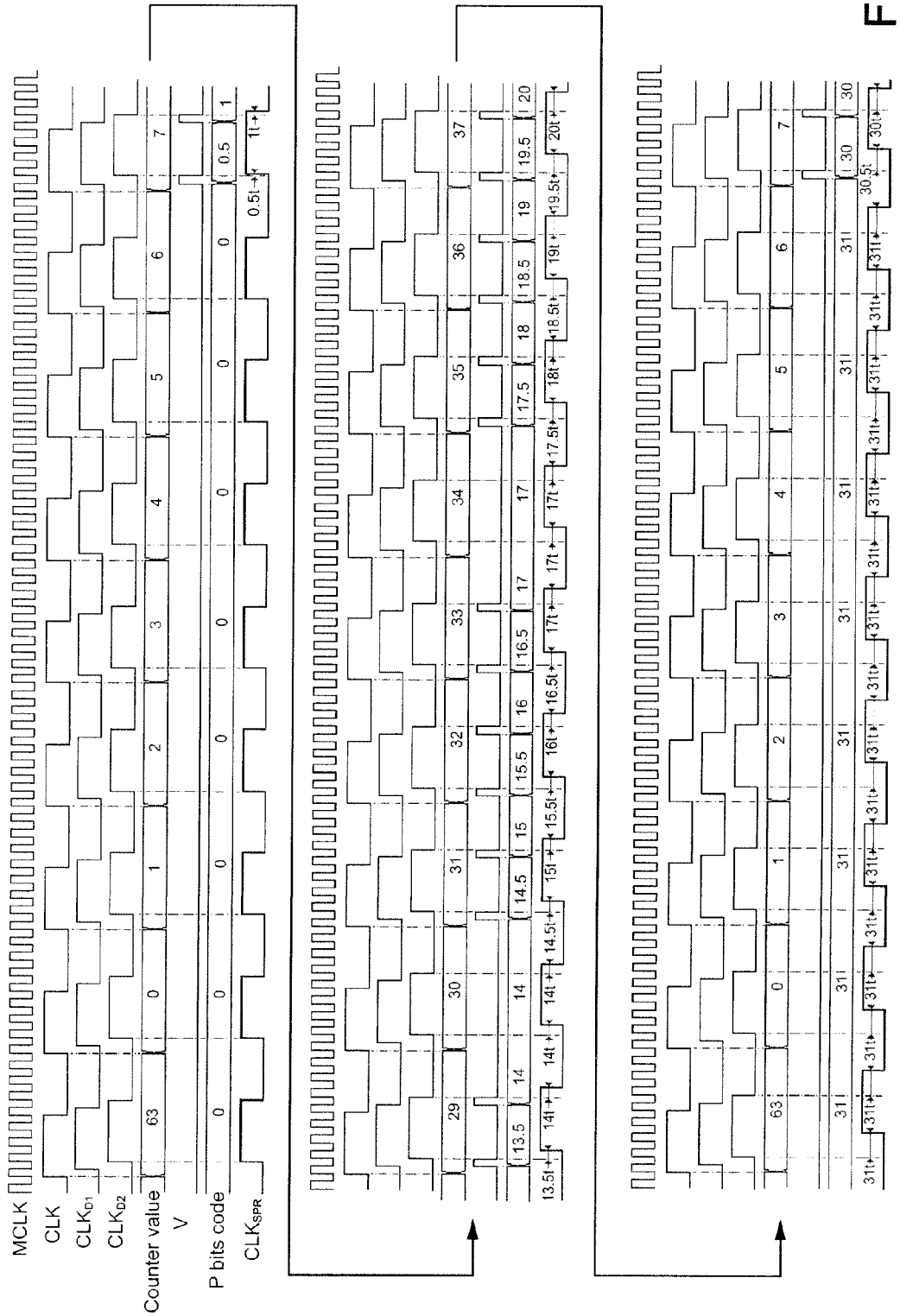
FIG. 5 is a chart showing signals generated during steps of the method according to some embodiments of the invention.

Example of signals MCLK, CLK, $CLK_{D1}$ and $CLK_{D2}$ are represented in FIG. 5.

In step S3, the counter 8 receives the clock signal CLK, and generates, at each period of the clock signal CLK, a M bits code corresponding to a counter value.

In step S4, the decoder 9 sets the variable V value depending on the counter value, according to predetermined distribution curves to be followed. Step S4 is performed at each reception of a counter value, that is to say at each period of the clock signal CLK.

In step S5, the sequencer 11 generates a P bits code corresponding to a counting value of the sequencer 11. Step S5 is performed at each front edge of the output signal of the logic gate block 10.

In step S6, the delay line 5 generates the spread spectrum clock signal $CLK_{SPR}$ from the clock signal CLK, by using the current P bits code. Step S6 is performed at each period of the second delayed clock signal $CLK_{D2}$.

In step S7, the triangular waveform oscillator 6 generates the spreading processing signal PS from the spread spectrum clock signal $CLK_{SPR}$.

Steps S2 to S7 may be performed in parallel to step S1.

In step S8, the modulator 7 modulates the spreading processing signal PS as a function of the analog audio signal $AS_A$.

In step S9, the modulated signal is transmitted to the speaker 12.

This method aims at quantifying the delay (timing jitter and period jitter) with a reduced number of bits. In particular, timing jitter and period jitter may be controlled to get the higher timing jitter with the lower period jitter.

The audio driver 1 may thus aim at reducing the high frequency spurious (of around 11 dB) for ultra low EMI. Moreover, the audio driver 1 does not affect idle noise in audio band nor efficiency.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the invention as broadly defined above.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

A person skilled in the art will readily appreciate that various parameters disclosed in the description may be modified and that various embodiments disclosed may be combined without departing from the scope of the invention.

The invention claimed is:

1. A signal processing electronic device configured to reduce electromagnetic noise, the electronic device comprising:
    a delay line configured to generate a spread spectrum clock signal from an input clock signal, a timing jitter and a period jitter of the spread spectrum clock signal being controlled at each period of the spread spectrum clock signal based on a digital code;
    an oscillator configured to use the spread spectrum clock signal to generate a processing signal; and
    a modulator configured to modulate the processing signal as a function of an audio signal.

2. The electronic device according to claim 1, wherein the timing jitter and the period jitter are controlled to follow predetermined distribution curves.

3. The electronic device according to claim 2, wherein the predetermined distribution curves comprise sine waves.

4. The electronic device according to claim 1, wherein the delay line comprises a set of delay blocks in cascade, each delay block comprising a resistor-capacitor (RC) circuit, and each delay block being controlled based on one bit of the digital code.

5. The electronic device according to claim 4, wherein a unitary delay quantization is defined by a first capacitance of a first RC circuit, with a capacitance of each remaining RC circuit being a multiple of the first capacitance.

6. The electronic device according to claim 1, further comprising, a digital code generator configured to generate, at each period, the digital code, the digital code generator comprising:

a counter configured to generate a counter value from the input clock signal;

a decoder configured to receive the counter value and to set a binary variable value based on the counter value; and a sequencer configured to receive the binary variable value and to generate the digital code based on the binary variable value.

7. The electronic device according to claim 6, wherein the counter value comprises M bits, and wherein the counter comprises M outputs for generating the M bits of the counter value, M being an integer.

8. The electronic device according to claim 6, wherein the counter comprises a first set of latches connected in cascade, an output of each latch providing a bit of the counter value.

9. The electronic device according to claim 6, wherein the sequencer comprises a second set of latches connected in cascade, an output of each latch providing a bit of the digital code.

10. A method of processing a signal to reduce electromagnetic noise, the method comprising:

generating a spread spectrum clock signal from an input clock signal, a timing jitter and a period jitter of the spread spectrum clock signal being controlled at each period of the spread spectrum clock signal based on a digital code;

using the spread spectrum clock signal to generate a processing signal; and modulating the processing signal as a function of an audio signal.

11. The method according to claim 10, further comprising controlling the timing jitter and the period jitter to follow predetermined distribution curves.

12. The method according to claim 11, wherein the predetermined distribution curves comprise sine waves.

13. The method according to claim 10, further comprising generating, at each period, a digital code by:

generating a counter value from the input clock signal;

setting a binary variable value based on the counter value; and generating the digital code based on the binary variable value.

14. A computer program product stored in a non-transitory computer readable medium for controlling a data-processing unit, the computer program product comprising software instructions which, when run on the data-processing unit cause the data processing unit to:

generate a spread spectrum clock signal from an input clock signal, a timing jitter and a period jitter of the spread spectrum clock signal being controlled at each period of the spread spectrum clock signal based on a digital code;

use the spread spectrum clock signal to generate a processing signal; and modulate the processing signal as a function of an audio signal.

* * * * *